United States Patent

Ito et al.

Patent Number: 5,759,887
Date of Patent: Jun. 2, 1998

[54] SEMICONDUCTOR DEVICE AND A METHOD OF MANUFACTURING A SEMICONDUCTOR DEVICE

[75] Inventors: Takao Ito, Tokyo; Masayuki Ayabe, Kanagawa-ken, both of Japan

[73] Assignee: Kabushiki Kaisha Toshiba, Kawasaki, Japan

[21] Appl. No.: 867,897

[22] Filed: Jun. 3, 1997

Related U.S. Application Data

[63] Continuation of Ser. No. 554,714, Nov. 7, 1995, abandoned.

[30] Foreign Application Priority Data

Nov. 17, 1994 [JP] Japan .................................. 6-283467

[51] Int. Cl.⁶ .................................. H01L 21/8234
[52] U.S. Cl. .......................... 438/238; 438/384; 438/396; 438/554
[58] Field of Search .................. 438/238, 384, 438/396, 554; 257/380, 381, 532, 533, 538

[56] References Cited

U.S. PATENT DOCUMENTS

| | | | |
|---|---|---|---|
| 3,864,817 | 2/1975 | Lapham, Jr. et al. | 437/54 |
| 4,419,812 | 12/1983 | Topich | 438/396 |
| 4,502,894 | 3/1985 | Seto et al. | 437/918 |
| 4,577,390 | 3/1986 | Haken | 437/919 |
| 5,187,559 | 2/1993 | Isobe et al. | 257/538 |
| 5,356,826 | 10/1994 | Natsume | 438/396 |
| 5,407,857 | 4/1995 | Higuchi | 437/156 |
| 5,470,775 | 11/1995 | Nariani | 437/919 |
| 5,500,387 | 3/1996 | Tung et al. | 437/919 |
| 5,597,759 | 1/1997 | Yoshimori | 438/396 |

FOREIGN PATENT DOCUMENTS

0661423  3/1994  Japan ......................... 257/533

Primary Examiner—Charles L. Bowers, Jr.
Assistant Examiner—Toniae M. Thomas
Attorney, Agent, or Firm—Banner & Witcoff, Ltd.

[57] ABSTRACT

A method of manufacturing a semiconductor integrated circuit (IC) includes the steps of forming a polycrystalline silicon layer containing impurities on a semiconductor substrate; forming an oxidation-resistant insulating layer on the polycrystalline silicon layer; simultaneously forming resist patterns for forming a capacitor element and a resistor element on the oxidation-resistant insulating layer; and patterning the oxidation-resistant insulating layer and the polycrystalline silicon layer in sequence using resist patterns.

9 Claims, 7 Drawing Sheets

SEMICONDUCTOR DEVICE AND A METHOD OF MANUFACTURING A SEMICONDUCTOR DEVICE

This application is a continuation of application Ser. No. 08/554,714, filed Nov. 7, 1995, now abandoned.

BACKGROUND OF THE INVENTION

1. Field of the Invention

The present invention relates to a method of manufacturing a semiconductor device, and more particularly to a method of manufacturing a semiconductor integrated circuit (IC) containing capacitor elements and resistor elements. The present invention further relates to a semiconductor device manufactured according to this method.

2. Description of the Related Art

Capacitor elements are often formed using a MOS structure including a Si substrate, a silicon oxide layer, and an upper electrode. However, since silicon oxide has a relatively low dielectric constant (about 3.8), a MIS-type capacitor element using a silicon nitride (SiN) layer with a larger dielectric constant (about 7.8) has been proposed to increase the capacitance value per unit area. Resistor elements made from polycrystalline silicon having a low voltage dependence are also widely used.

Hereinafter, a method of manufacturing an IC containing these capacitor and resistor elements will be described in conjunction with FIGS. 8 through 15.

Figure 8:
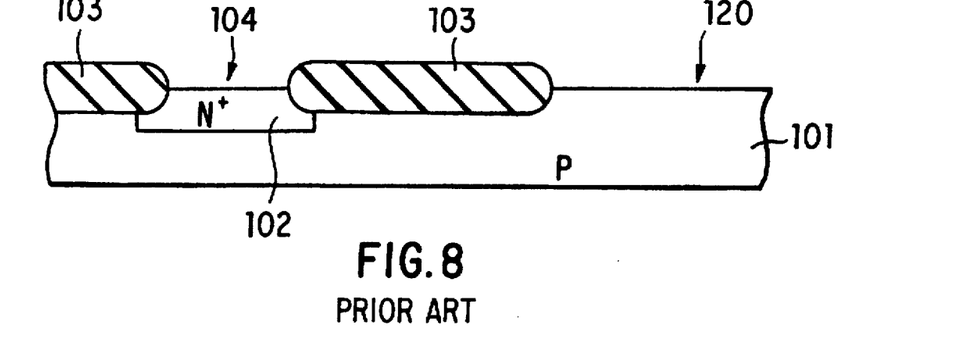
FIG. 8 is a sectional view illustrating the first step in a known manufacturing method.

As shown in FIG. 8 an N+ region 102 serving as the lower electrode is formed in a P-type silicon substrate 101, and then a field oxide layer 103 is formed using conventional LOCOS techniques. Thereafter, a capacitor region 104 and a transistor region 120 are defined.

Figure 9:
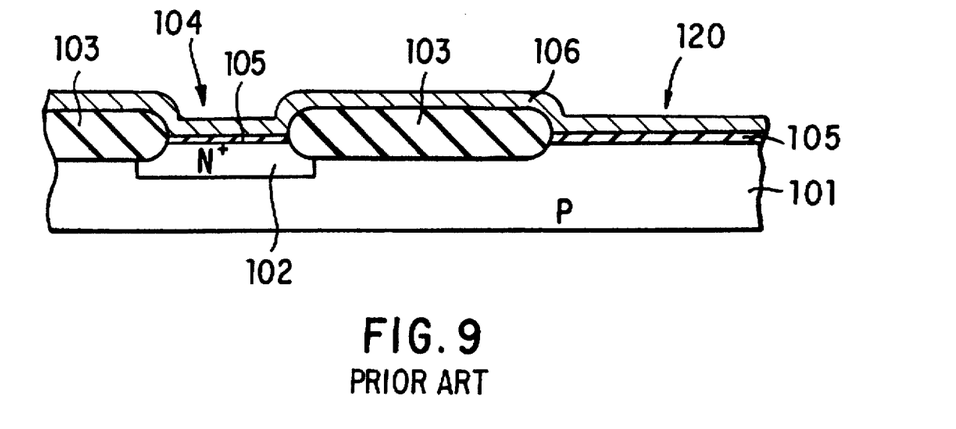
FIG. 9 is a sectional view illustrating the second step in the known manufacturing method.
Figure 10:
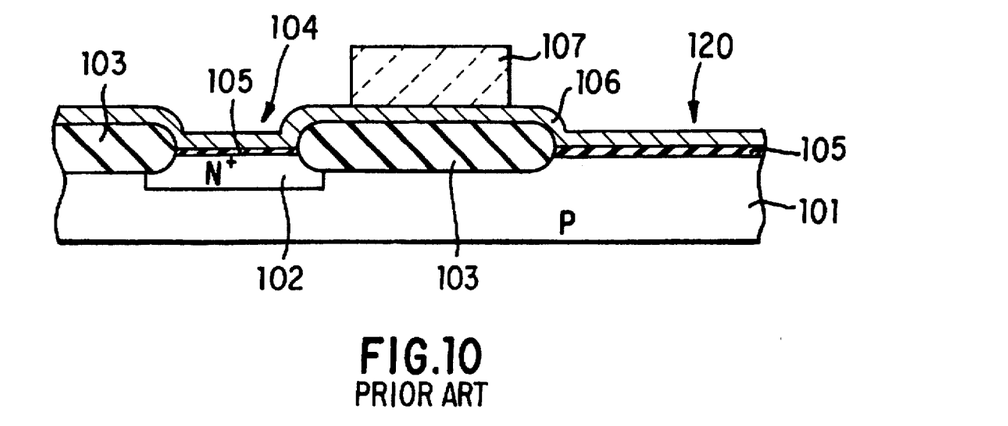
FIG. 10 is a sectional view illustrating the third step in the known manufacturing method.

As shown in FIG. 9, after a thin layer 105 of oxide is formed on the capacitor region of substrate surface, a layer 106 of polycrystalline silicon is deposited over the substrate surface including the field oxide layer 103. The polycrystalline silicon layer 106 is ion implanted with predetermined impurities so that a desired resistance value can be obtained (FIG. 9). After that, a resist pattern 107 for forming a resistor element is formed on the polycrystalline silicon layer 106 located on the field oxide layer 103 (FIG. 10).

Figure 11:
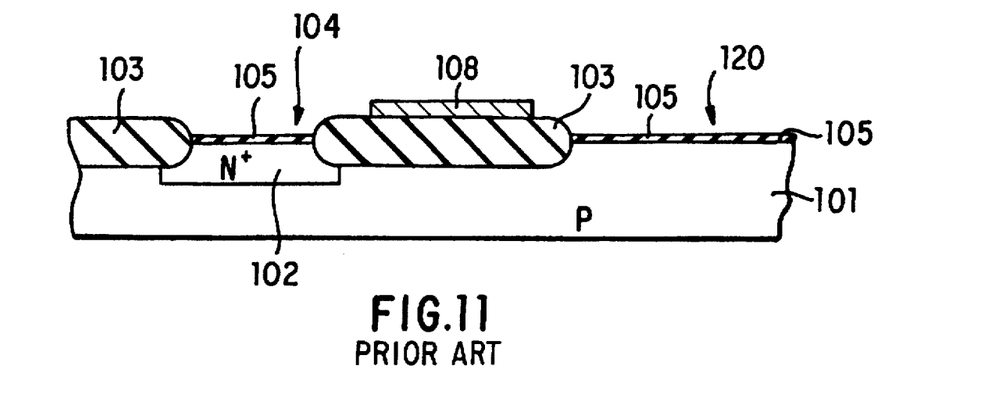
FIG. 11 is a sectional view illustrating the fourth step in the known manufacturing method.
Figure 12:
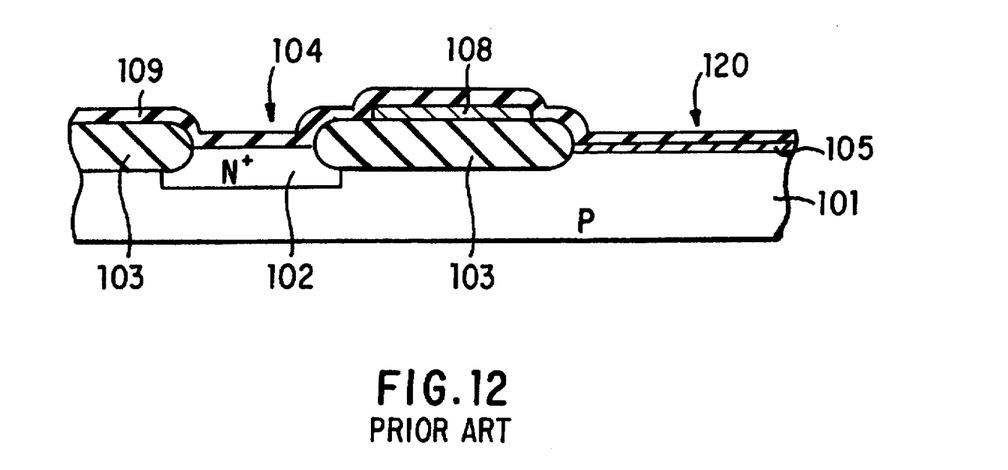
FIG. 12 is a sectional view illustrating the fifth step in the known manufacturing method.
Figure 13:
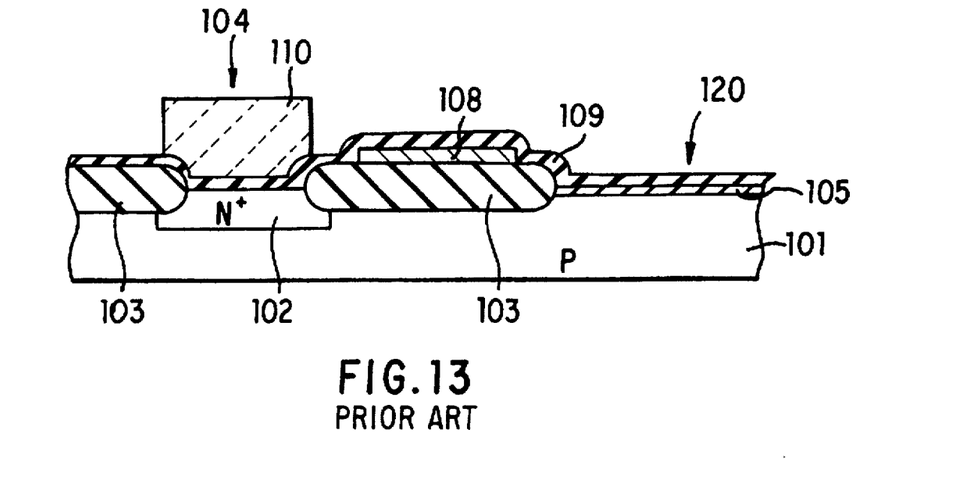
FIG. 13 is a sectional view illustrating the sixth step in the known manufacturing method.
Figure 14:
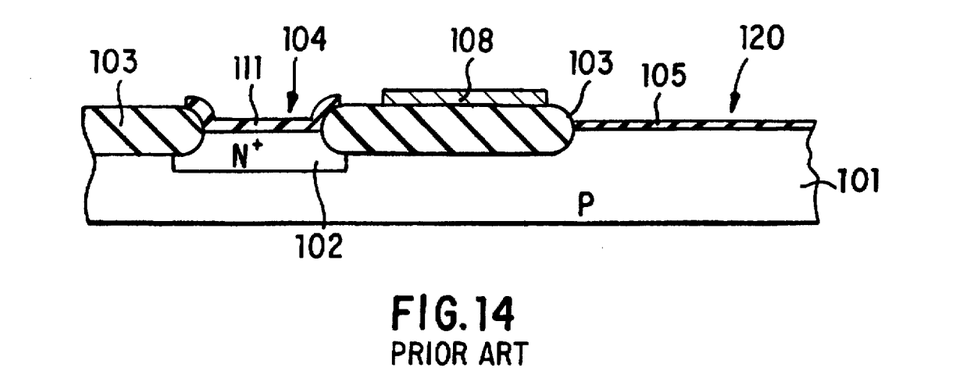
FIG. 14 is a sectional view illustrating the seventh step in the prior art.
Figure 15:
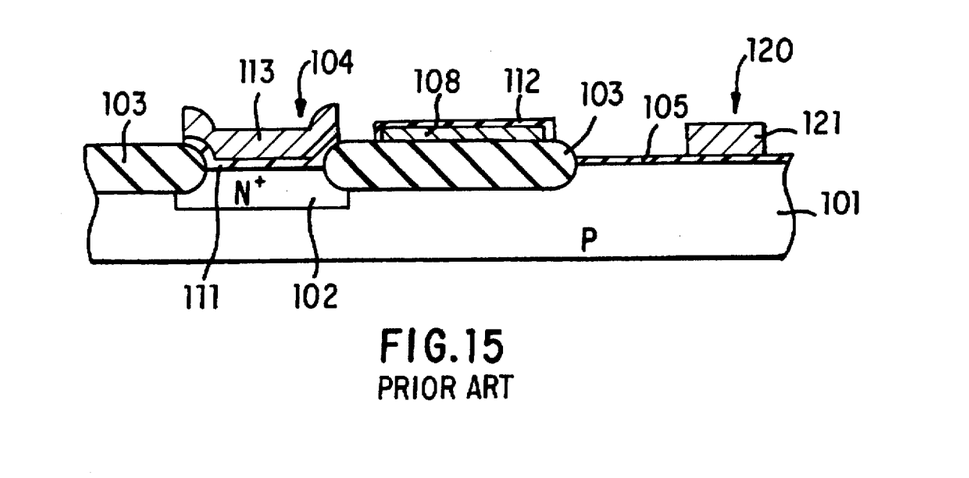
FIG. 15 is a sectional view illustrating the eighth step in the prior art.

After the polycrystalline silicon layer 106 is etched away by using the resistant pattern 107 as a mask, the resistant pattern 107 is removed to form a resistor element 108 (FIG. 11). After the thin layer 105 of the oxide on the N+ region 102 is selectively removed from the substrate surface, an SiN layer 109 having a large dielectric constant as described above is deposited over the substrate surface (FIG. 12). Thereafter, a resist pattern 110 is formed on the capacitor-formed region 104 (FIG. 13). Next, the SiN layer 109 is removed by using the resist pattern 110 as a mask, thereby forming an SiN layer 111 serving as the insulating layer of a capacitor element in the capacitor-formed region 104 (FIG. 14). After an oxide layer 112 is formed on the resistor element 108, a polycrystalline silicon layer 113 serving as the top electrode is formed on the SiN layer 111 by a conventional method (FIG. 15).

Finally, the polycrystalline silicon layer is disposed on the transistor formation region 120 by a conventional method. Thereby, the gate electrode 121 is formed (FIG. 15).

In the method described above, however, the resistor 108 and the SiN layer 111 are formed by separate steps. Therefore, the number of manufacturing steps for patterning resist layers increases. In addition, since the surface of the resistor element 108 is exposed, when the substrate 101 is subjected to an oxidizing step for forming a gate oxide layer, the surface of the resistor element 108 will be oxidized and its layer thickness will vary. This results in variations in resistance value. Additionally, the top electrode 113 and the gate electrode 121 are formed by separate steps. Therefore, additional steps are needed to pattern the polycrystalline layer.

SUMMARY OF THE INVENTION

It is accordingly the object of the present invention to provide a method of manufacturing a semiconductor integrated circuit (IC) containing capacitor elements and resistor elements which eliminates the above-described conventional drawbacks.

This invention provides a method of manufacturing a semiconductor device including the steps of forming a polycrystalline silicon layer containing impurities on an insulating layer formed on a semiconductor substrate; forming an oxidation-resistant insulating layer on the polycrystalline silicon layer; forming resist patterns for forming a capacitor element and a resistor element on the oxidation-resistant insulating layer; and patterning the oxidation-resistant insulating layer and the polycrystalline silicon layer in sequence by using the resist patterns.

Further, this invention provides a method of manufacturing a semiconductor device in which the oxidation-resistant insulating layer is an SiN layer.

Further, this invention provides a method of manufacturing a semiconductor device in which the impurities contained in the polycrystalline silicon layer are introduced by ion implantation.

Further, this invention provides a method of manufacturing a semiconductor device in which the insulating layer is a field oxide layer.

Further, this invention provides a method of manufacturing a semiconductor device including the steps of selectively forming an insulating layer so as to expose portions of an impurity diffused layer on a semiconductor substrate; forming a polycrystalline silicon layer containing impurities on the entire surface of the semiconductor substrate including the impurity diffused layer and the insulating layer; forming an oxidation-resistant insulating layer on the polycrystalline silicon layer; forming resist patterns for forming a conductor element and a resistor element on the oxidation-resistant insulating layer; and patterning the oxidation-resistant insulating layer and the polycrystalline silicon layer in sequence by using the resist patterns.

Further, this invention provides a method of manufacturing a semiconductor device in which the step of forming the polycrystalline silicon layer further includes a step of heating the semiconductor substrate to diffuse impurities from the impurity diffused layer into the polycrystalline layer.

Further, this invention provides a semiconductor device including a semiconductor substrate, an impurity diffused region disposed in the semiconductor substrate, an insulating layer disposed on the semiconductor substrate so as to expose the impurity diffused layer, a first polycrystalline silicon layer containing impurities disposed on impurity diffused layer, a first oxidation-resistant insulating layer on the first polycrystalline silicon layer, a second polycrystalline silicon layer disposed on the first oxidation-resistant insulating layer, a third polycrystalline silicon layer containing impurities lower than the first polycrystalline silicon disposed on the insulating layer, and a second oxidation-resistant insulating layer on the third polycrystalline silicon layer.

According to the manufacturing method and semiconductor device according to the present invention, the SiN layer serving as the conductor element is formed on the polycrystalline layer. Therefore, the SiN layer is protected from damage to the underlying layer which may occur when the polycrystalline silicon layer is doped with impurities. That is, the reliability of the SiN layer is not lost. In addition, since the polycrystalline silicon layer serving as a resistor element is coated with the SiN layer, a subsequent oxidizing step will not lead to a change in the thickness of the silicon layer. Thus, variations in resistance of the resistor element can be significantly reduced.

BRIEF DESCRIPTION OF THE DRAWINGS

The present invention will now be described with reference to the accompanying drawings which are incorporated in and constitute a part of the specification.

DETAILED DESCRIPTION OF THE EMBODIMENTS

The embodiments of the present invention will be described below with reference to the attached drawings.

Hereinafter, a first embodiment of the present invention will be described in conjunction with FIGS. 1 through 6.

Figure 1:
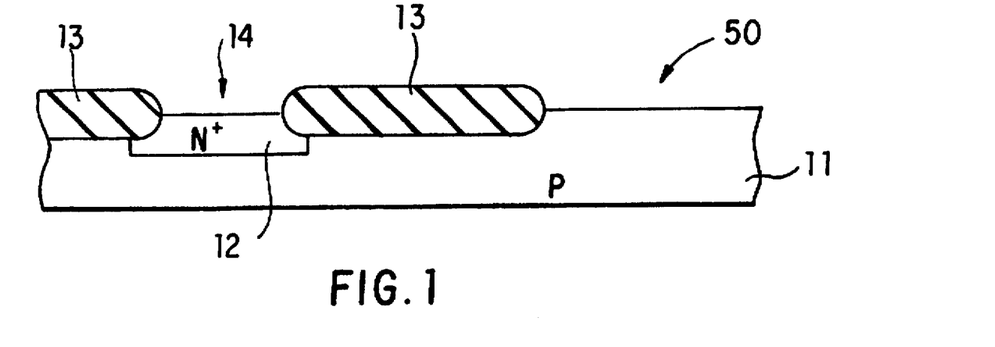
FIG. 1 is a sectional view illustrating the first step in a first embodiment of the present invention.

An N+ region 12 serving as the lower electrode is first formed in a p-type silicon substrate 11, and then a field oxide layer 13 is formed by using the conventional LOCOS technique. A capacitor region 14 and a transistor region 50 are defined (FIG. 1).

Figure 2:
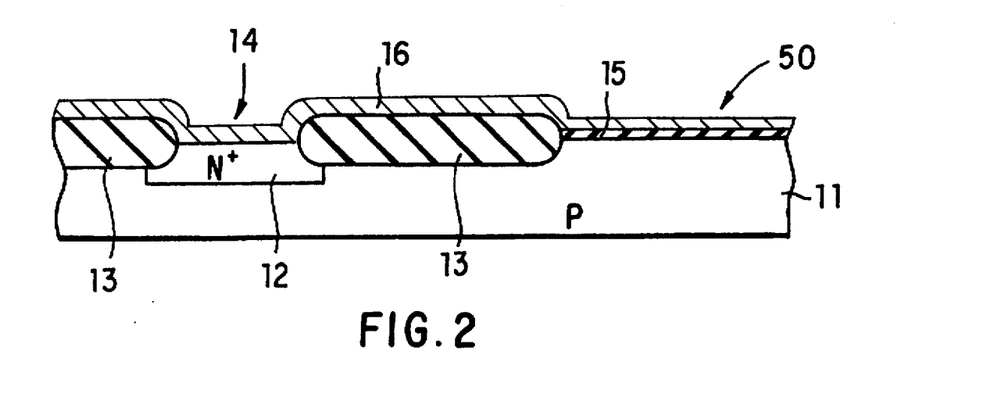
FIG. 2 is a sectional view illustrating the second step in the first embodiment of the present invention.

After a thin layer 15 of oxide is formed over the surface of the substrate, the thin oxide layer 15 located on the N+ region 12 is selectively removed. After that, a polycrystalline silicon layer 16 is deposited onto the substrate surface including the field oxide layer 13 to a thickness of about 400 nm, and predetermined impurities of, for example, phosphorous are ion implanted into the polycrystalline silicon layer 16 so that a desired resistance value can be obtained (FIG. 2). In this step, the semiconductor is heated to about 900–950 degrees centigrade. Note that the heating step during this operation allows impurities to be diffused from the N+ region 12 into the polycrystalline silicon layer 16, so that the layer becomes low in resistance. For example, if the sheet resistance of the N+ region 12 is 50 ohms and the sheet resistance of the polycrystalline silicon layer 16 is 100 ohms at the time before the heating step, the sheet resistance of the polycrystalline silicon layer 16 decreases to about 80 ohms after the heating step.

When the substrate 11 is N-type semiconductor and the impurity region 12 is p+ region, boron instead of phosphorous is ion implanted into the polycrystalline silicon layer 16.

Figure 3:
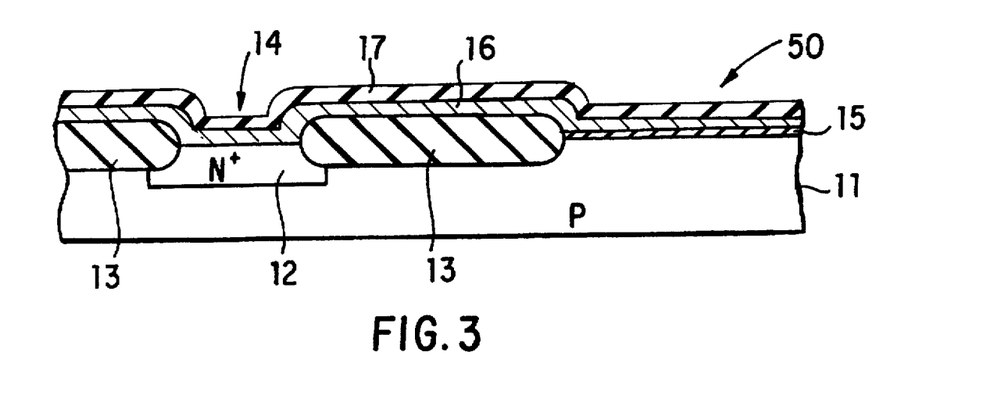
FIG. 3 is a sectional view illustrating the third step in the first embodiment of the present invention.

Subsequently, an SiN layer 17 having a relatively large dielectric constant is deposited onto the polycrystalline silicon layer 16 to a thickness of about 25 nm (FIG. 3).

Figure 4:
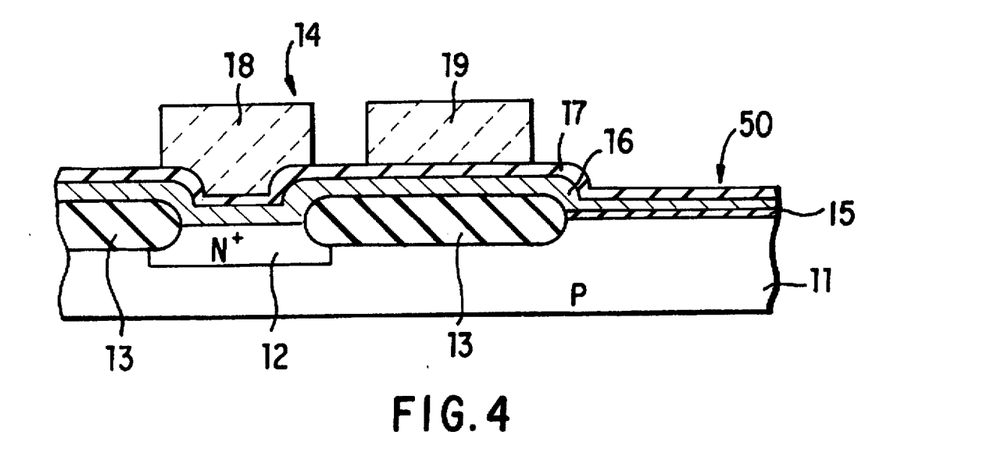
FIG. 4 is a sectional view illustrating the fourth step in the first embodiment of the present invention.

Next, the SiN layer 17 is coated with a resist, and the resist is then subjected to a lithographic and etching operation to simultaneously form a resist pattern 18 for forming a capacitor element and a resist pattern 19 for forming a resistor element (FIG. 4).

Figure 5:
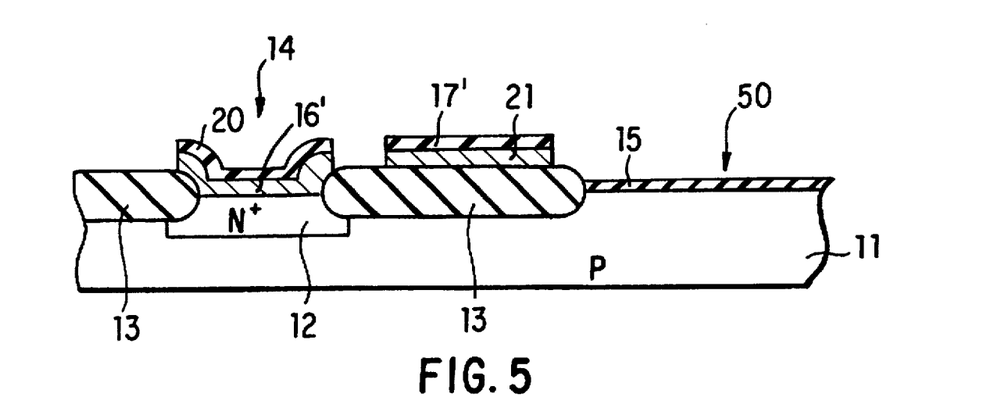
FIG. 5 is a sectional view illustrating the fifth step in the first embodiment of the present invention.

After the SiN layer 17 and the polycrystalline silicon layer 16 are etched in sequence using the resist patterns 18 and 19 as a mask, the resist pattern 18 and 19 are removed to form a capacitor element 20 and a polycrystalline silicon layer 16', and an SiN layer 17' and a resistor element 21 (FIG. 5).

Figure 6:
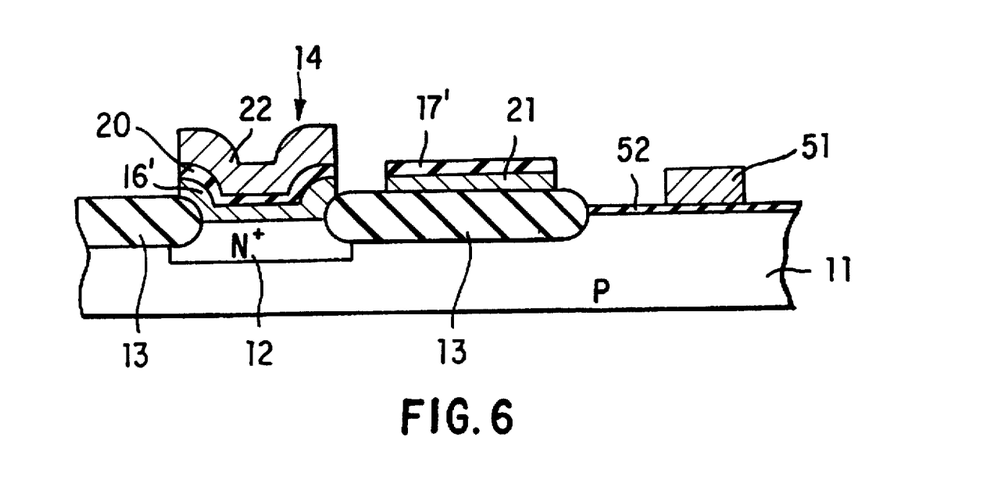
FIG. 6 is a sectional view illustrating the sixth step in the first embodiment of the present invention.

Next, gate oxidation is carried out to form a gate oxide film 52. The thickness of the gate oxide film is, e.g., 25 nm. Then, a polycrystalline silicon layer 22 is formed simultaneously with a MOS gate 51 (FIG. 6). The polycrystalline silicon layer 22 serves as the upper electrode of the capacitor element 20.

In the present embodiment as shown in FIG. 2, the polycrystalline silicon layer 16 is subjected to ion implantation after it has been deposited on the substrate 11. However, it is also possible to dope the polycrystalline silicon layer 16 when it is deposited. Moreover, it is also possible to subject only a portion of the polycrystalline silicon layer 16 serving as the resistor element 21 to ion implantation to adjust its resistance value. Furthermore, it is also possible to ion implant impurities into the resistor element 21 to adjust its resistance value after the resister element 21 is formed.

According to the above-described method, since the capacitor element 20 and the resistor element 21 are formed simultaneously, only one patterning step is needed. As a result, the number of processing steps is decreased. In addition, the patterning step to form the resistor element 21 is carried out after the surface of the polycrystalline silicon layer 16 is coated with the oxidation-resistant SiN layer 17.

This prevents the surface of the resistor element 21 from being oxidized in a subsequent oxidizing step, for example, the gate oxide layer forming step. Thus, the variations in resistance due to changes in the layer thickness of the resistor element 21 can be greatly reduced. Moreover, in the capacitor structure according to the present embodiment, since the polycrystalline silicon layer 16' is formed below the capacitor element 20, its resistance value can be decreased because impurities are diffused from the N+ region 12 into the polycrystalline silicon layer 16'. Therefore, the resistance of the resistor element 21 can be increased significantly while the resistance of the lower electrode 16' of the capacitor element 20 is only slightly increased. In this embodiment, a resistor having relatively high resistance and a capacitor having lower electrode with relatively low resistance are formed.

Next, a second embodiment of the present invention will be described with reference to FIG. 7. The numbered portions of the second embodiment shown in FIG. 7 correspond to portions having the same numbers as shown in FIG. 6.

Figure 7:
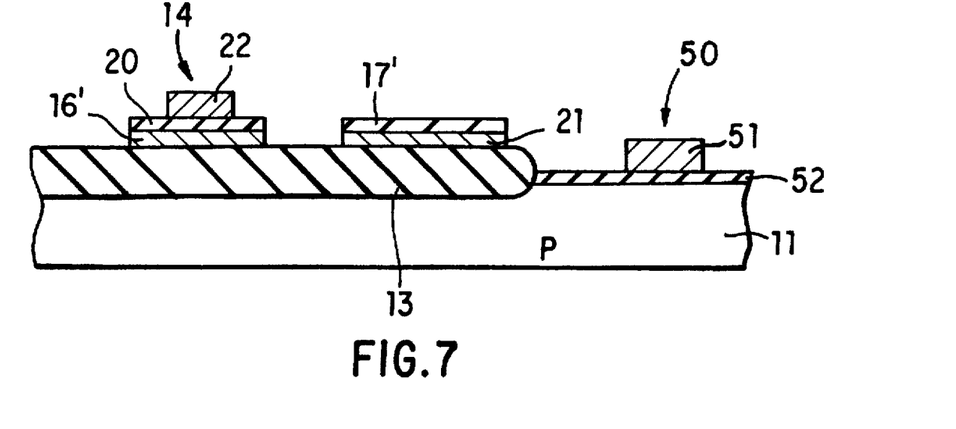
FIG. 7 is a sectional view illustrating a second embodiment of the present invention.

In FIG. 7, a field oxide layer 13 is selectively formed on the surface of silicon substrate 11. A capacitor oxide 20 is then formed on the surface of field oxide layer 13. Unlike the first embodiment wherein the capacitor element is formed on N+ region 12 (see FIG. 6), in the second embodiment, the capacitor element is formed on field oxide layer 13 (see FIG. 7).

Thus, the semiconductor device structure of FIG. 7 allows a capacitor element and a resistor element to be formed simultaneously and can obtain the same advantages as the structure of the first embodiment shown in FIG. 6. Thus, if there is a demand for designing the location of the capacitor on the field oxide, this embodiment can be suitable to the demand and achieve above mentioned advantages. If the capacitor is disposed on the field oxide 13, the lower electrode 16' is insulated from impurity region by the field oxide 13. Therefore, in this embodiment, the accuracy of capacitance of the capacitor can be increased.

A method for manufacturing a third embodiment according to the present invention is illustrated in FIGS. 16 through 20.

Figure 16:
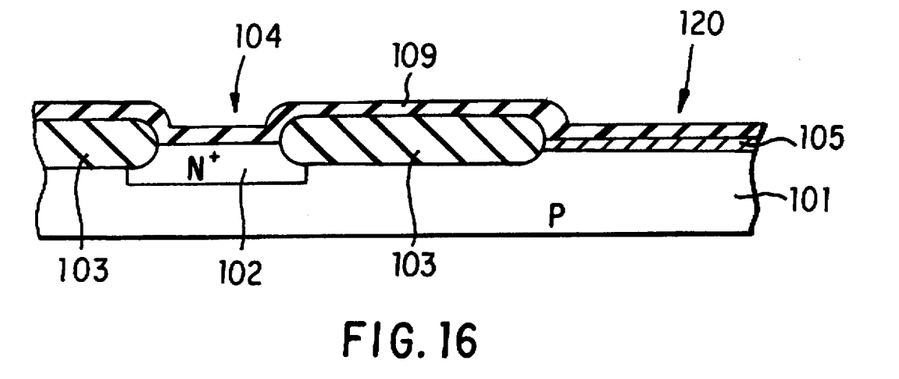
FIG. 16 is a sectional view illustrating the first step in a third embodiment of the present invention.
Figure 17:
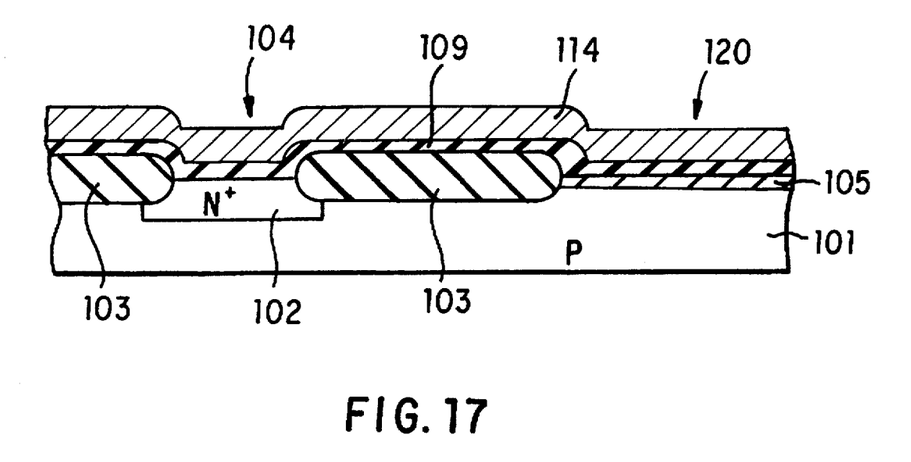
FIG. 17 is a sectional view illustrating the second step in the third embodiment.
Figure 18:
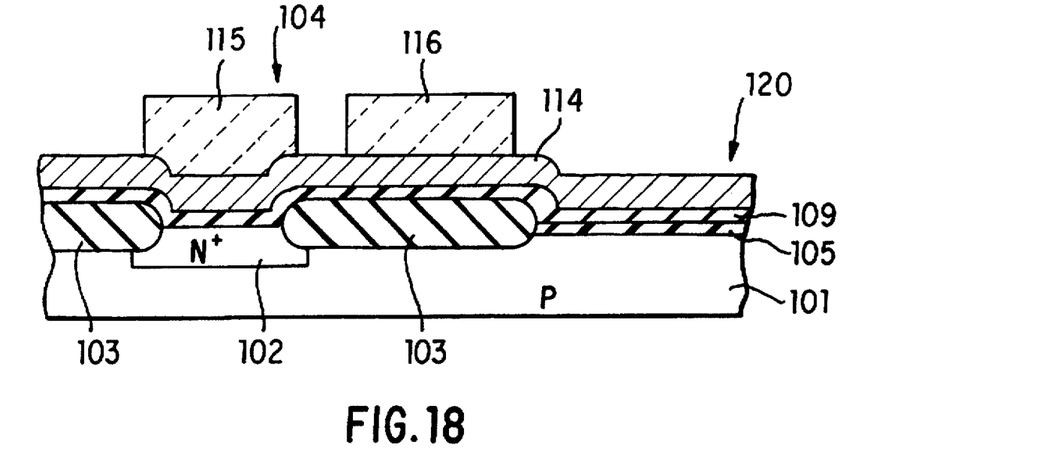
FIG. 18 is a sectional view illustrating the third step in the third embodiment.
Figure 19:
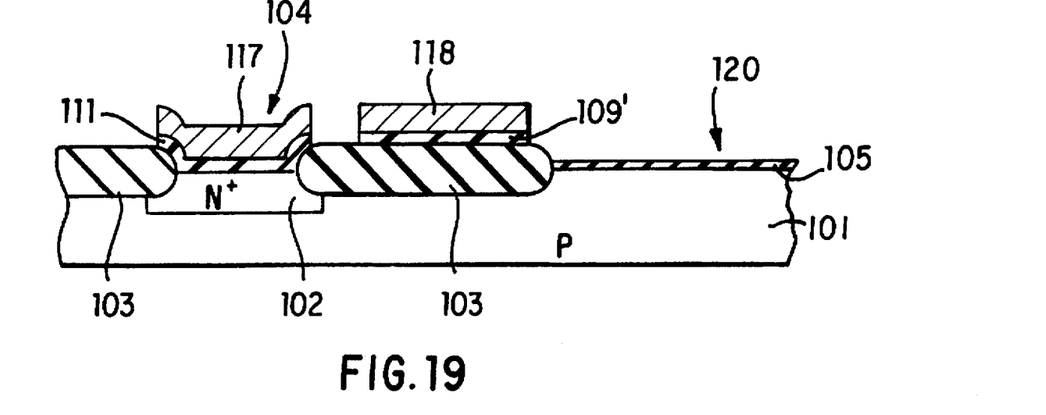
FIG. 19 is a sectional view illustrating the fourth step in the third embodiment.
Figure 20:
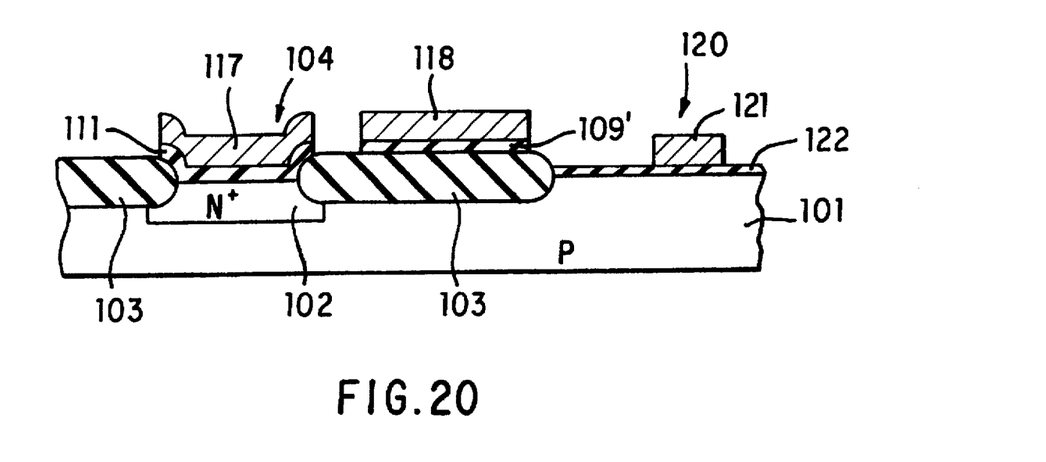
FIG. 20 is a sectional view illustration the fifth step in the third embodiment.

First, a p-type silicon substrate 101 is prepared which has an N+ region 102 serving as the lower electrode, a field oxide layer 103, and a capacitor-formed region 104 as shown in FIG. 16. After a thin layer 105 of oxide is formed over the substrate surface and the thin oxide layer 105 on the N+ region 102 is selectively removed, an SiN layer 109 having a large dielectric constant is deposited over the substrate surface including the field oxide layer 103 (FIG. 16). A polycrystalline silicon layer 114 is formed over the SiN layer 109 and then ion implanted with predetermined impurities so that a desired resistance value can be obtained (FIG. 17). After that, in order to form the top electrode of the capacitor element in the capacitor-formed element 104 and a resistor element over the field oxide layer 103, resist patterns 115 and 116 are simultaneously provided on the polycrystalline silicon layer 114 (FIG. 18). By using the resist patterns as masks, the polycrystalline silicon layer 114 and the SiN layer 109 are patterned simultaneously to form a capacitor element 111, the upper electrode 117 of the capacitor element 111, a resistor element 118, and an SiN layer 109' (FIG. 19). In the next step, the gate oxide film 122 is formed by gate oxidation. After that, the gate electrode 121 is formed by conventional method (FIG. 20).

With such a method, the polycrystalline silicon layer 114 and the SiN layer 109 are removed simultaneously, and the patterning steps for resist layers are omitted.

According to the present invention, MIS type capacitor element and a resistor element which are highly reliable can be formed with precision using a reduced number of manufacturing steps.

Numerous modifications and variations of the present invention are possible in light of the above teachings. It is therefore to be understood that, within the scope of the appended claims, the present invention can be practiced in a manner other than as specifically described herein.

What is claimed is:

1. A method of manufacturing a semiconductor device comprising the steps of:

forming a polycrystalline silicon layer containing impurities on a semiconductor substrate;

forming a single oxidation-resistant insulating layer on and contacting the polycrystalline silicon layer;

forming resist patterns for forming a first electrode of a capacitor element and a resistor element on the oxidation-resistant insulating layer; and etching the oxidation-resistant insulating layer and the polycrystalline silicon layer by using the resist patterns to simultaneously form said first electrode of said capacitor element and said resistor; and depositing a polysilicon layer on the semiconductor substrate to simultaneously form a second electrode of said capacitor element and a gate electrode.

2. A method of manufacturing a semiconductor device according to claim 1, wherein the oxidation-resistant insulating layer is an SiN layer.

3. A method of manufacturing a semiconductor device according to claim 1, wherein the impurities contained in the polycrystalline silicon layer are introduced by ion implantation.

4. A method of manufacturing a semiconductor device according to claim 1, wherein said resist patterns for forming said capacitor element and said resistor elements are formed simultaneously.

5. A method of manufacturing a semiconductor device comprising the steps of:

forming an impurity diffused layer in a surface of a semiconductor substrate;

selectively forming an insulating layer on the surface of said semiconductor substrate so as to expose the impurity diffused layer, thereby creating a capacitor region including said exposed impurity diffusion region and a transistor region on the semiconductor substrate;

forming a polycrystalline silicon layer containing impurities on the entire surface of the semiconductor substrate including the impurity diffused layer and the insulating layer;

forming a single oxidation-resistant insulating layer on and contacting the polycrystalline silicon layer;

forming resist patterns for forming a first electrode of a capacitor element and a resistor element on the oxidation-resistant insulating layer;

etching the oxidation-resistant insulating layer and the polycrystalline silicon layer by using the resist patterns to simultaneously form said first electrode of said capacitor element and said resistor element;

forming a gate oxide film on said capacitor element and said transistor region; and depositing a polycrystalline layer to form a second electrode of said capacitor element and a gate electrode on said transistor region.

6. A method of manufacturing a semiconductor device according to claim 5, wherein the step of forming the polycrystalline silicon layer further including a step of heating the semiconductor substrate to diffuse impurities from the impurity diffused layer to the polycrystalline layer.

7. A method of manufacturing a semiconductor device according to claim 5, wherein said resist patterns for forming said capacitor element and said resistor elements are formed simultaneously.

8. A method of manufacturing a semiconductor device according to claim 1, wherein, in said step of forming the polycrystalline silicon layer, a portion of the polycrystalline silicon layer is connected to an impurity diffusion region in the semiconductor substrate.

9. A method of manufacturing a semiconductor device comprising the steps of:

forming a silicon layer containing impurities on a semiconductor substrate;

forming a single oxidation-resistant insulating layer on and contacting the silicon layer;

forming resist patterns for forming a lower electrode of a capacitor element and a resistor element on the oxidation-resistant insulating layer;

etching the oxidation-resistant insulating layer and the silicon layer by using the resist patterns to simultaneously form said lower electrode of said capacitor element and said resistor element;

forming a gate oxide film on the semiconductor substrate; and depositing a polysilicon layer on the semiconductor substrate to simultaneously form an upper electrode of said capacitor element and a MOS gate.

* * * * *